United States Patent [19]
Nishimura et al.

[11] Patent Number: 5,999,458
[45] Date of Patent: *Dec. 7, 1999

[54] LATCH CIRCUIT, DATA OUTPUT CIRCUIT AND SEMICONDUCTOR DEVICE HAVING THE CIRCUITS

[75] Inventors: Koichi Nishimura; Shusaku Yamaguchi, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/100,038

[22] Filed: Jun. 19, 1998

[30] Foreign Application Priority Data

Dec. 10, 1997 [JP] Japan .................................. 9-340082

[51] Int. Cl.$^6$ .................................................. G11C 7/00

[52] U.S. Cl. ................ 365/189.05; 365/219; 365/230.09

[58] Field of Search .............................. 365/189.05, 219, 365/220, 221, 230.09, 239

[56] References Cited

U.S. PATENT DOCUMENTS 5,765,185  6/1998  Lambrache et al. ............... 365/189.05

*Primary Examiner*—Vu A. Le
*Attorney, Agent, or Firm*—Nikaido, Marmelstein, Murray & Oram LLP

[57] ABSTRACT

A latch circuit includes N data latch circuits to which N-bit parallel data are respectively applied where N is an integer, a data input control circuit setting the data latch circuits to a data input state in order, and a data output control circuit which controls the N data latch circuits to output, at different timings, latched data to M output terminals in the order of latch in the N data latch circuits where $N \geq M \geq 1$.

20 Claims, 10 Drawing Sheets

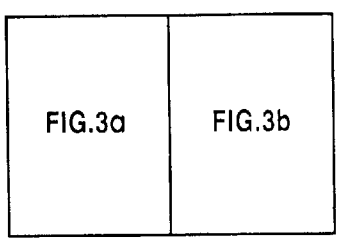
FIG.3
FIG.3a
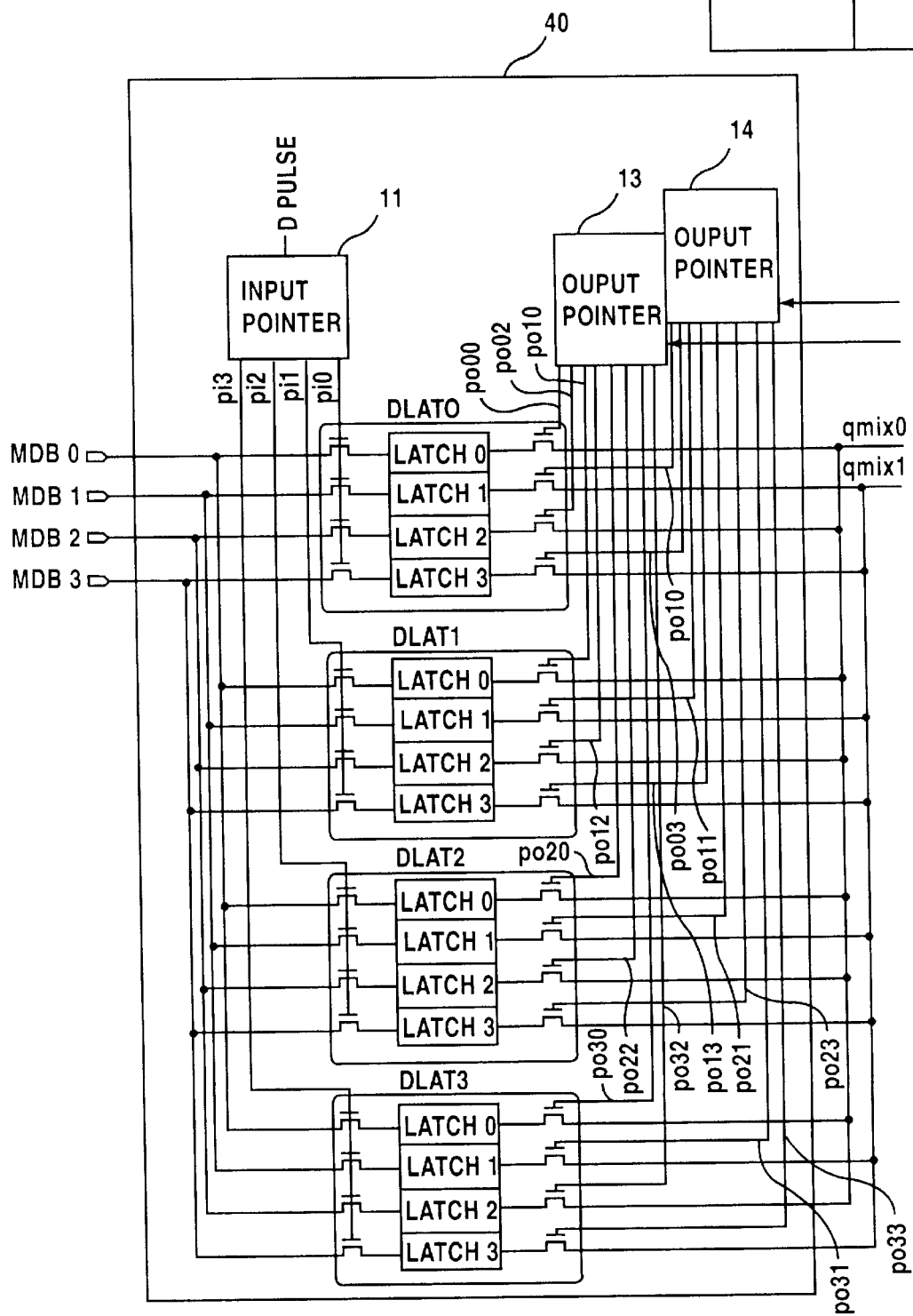

LATCH CIRCUIT, DATA OUTPUT CIRCUIT AND SEMICONDUCTOR DEVICE HAVING THE CIRCUITS

BACKGROUND OF THE INVENTION

1. Field of the Invention

The present invention relates to data output circuits having a latch function of outputting received data at a given timing, and to a semiconductor device such as a memory device equipped with such a data output circuit.

2. Description of the Related Art

Recently, semiconductor devices such as memory devices have been required to operate at higher speeds due to speeding up of microprocessors. Particularly, there has been considerable activity in the development of semiconductor devices which employ a pipeline technique.

The pipeline technique segments a series of processes (in memories, examples of those are address latch, address decode, read of data from cells, transfer of data to an output circuit, and data output) carried out in series into parts. A first process related to a first command is executed. Then, a second process related to the first command is started and simultaneously a first process related to a second command is started. Hence, the speed of processing commands can be increased substantially.

Normally, the pipeline technique is directed to segmenting a plurality of processes which are to be serially executed into parts so that the times it takes to execute these parts are equal to each other. Latch circuits are provided to the output sides of processing circuits which execute the segmented parts. However, in practice, semiconductor devices have a difficulty in that latch circuits are provided in positions so that the above processing circuits have an identical processing time.

With the above in mind, the semiconductor devices such as memory devices employ a particular pipeline called wave pipeline, in which data is output at a timing which lags, by a given number of clocks, behind the time when a read command is input (the latency of data output). In the wave pipeline, a pipe is configured by utilizing a propagation in logic circuits. Data latch circuits are provided in the vicinity of the output circuits. In order to operate the wave pipeline at a high speed due to speeding up of the microprocessors, it is necessary to reduce a time delay caused in an data output circuit which has a latch function and a parallel-to-serial conversion function.

FIG. 1 is a circuit diagram of a conventional configuration of a data output circuit provided in a synchronous DRAM device (hereinafter such a device will be referred to as an SDRAM device). The data output circuit shown in FIG. 1 includes an FIFO memory 10 of a pointer type forming a latch circuit, a parallel-to-serial converter circuit (hereinafter this circuit will be referred to as a PS converter circuit)20, and an output part 30. The FIFO memory 10 is connected to data input terminals MDB0, MDB1, MDB2 and MDB3 connected to a data bus extending from a memory core part (an illustration thereof is omitted). The FIFO memory 10 latches input data in parallel formation and outputs the latched input data to the PS converter circuit 20 in order of receipt thereof. The PS converter circuit 20 converts four-bit parallel data into two serial data trains (a 4:2 parallel-to-serial conversion), and outputs these trains to the output part 30. The output part 30 converts the two serial data trains into a single serial data train (a 2:1 parallel-to-serial conversion).

The FIFO memory 10 includes four data latch circuits DLAT0–DLAT4, an input pointer 11 and an output pointer 12. Each of the data latch circuits DLAT0–DLAT4 includes an input transfer gate, latch elements Latch0–Latch3, and an output transfer gate. The input transfer gate is made up of four MOS transistors controlled by the input pointer 11. The output transfer gate is made up of four MOS transistors controlled by the output pointer 12.

The PS converter circuit 20 includes latch elements Latch00–Latch30, Latch22, Latch32, transfer gates formed of transistors, and a parallel-to-serial pointer (hereinafter this pointer will be referred to as a PS pointer) 21. The output part 30 includes latch elements Latch0 and Latch1, an output clock generator 31, an output buffer 32, an output transistor 33 and a data output terminal DQ.

FIG. 2 is a timing chart of an operation of the data output circuit shown in FIG. 1. A read command is received by the semiconductor device having the output circuit shown in FIG. 2, and data "0"–"19" read from the memory core part are transferred over the data bus in synchronism with a data pulse (D-pulse) signal, and are applied to the FIFO memory 10 via data input terminals MDB0–MDB3. The input data are latched in the latches elements Latch0–Latch3 of the data latch circuits DLAT0–DLAT3 in response to control signals pi0–pi3 supplied from the input pointer 11. In FIG. 2, the latch element latch0 of the data latch circuit DLAT0 is indicated as DLAT0_L0. For example, in response to the control signal pi0, the latch elements DLAT_L0–DLAT3_L3 of the data latch circuit DLAT0 latch the input data "0"–"3", respectively. Then, the latched input data are output as Fout0–Fout3 in response to the control signals po1–po3 of the output pointer 12.

In response to a control signal ps0 output by the PS pointer 21 of the PS converter circuit 20, the data Fout0–Fout3 are input to the latch elements Latch00–Latch30, respectively. In response to a control signal ps1, the data in the latch element Latch00 is output as PSout0. In response to a control signal ps2, the data in the latch element Latch10 is output as PSout1, and the respective data latched in the latch elements Latch 20 and Latch30 are transferred to the latch elements Latch22 and Latch32. In response to a control signal ps3, the data in the latch element Latch22 is output as PSout0. In response to the control signal ps0, the data in the latch element Latch32 is output as PSout1. Then, next data are input to the latch elements Latch00–Latch30.

Hence, the output PSout0 has a data train such as "0", "2", "4", . . . , and the output PSout1 has a data train such as "1", "3", "5", . . . . That is, the parallel data Fout0–Fout3 are concerted into two serial data trains PSout0 and PSout1. That is, the 4:1 parallel-to-serial conversion is carried out. Then, the 2:1 parallel-to-serial conversion is implemented by the two transfer gates which control the output timings of the output part 30 in accordance with output timing clocks oclk0 and oclk1 which are generated by the output clock generator 31 and has a complementary relationship. The serial data thus obtained is output to the data output terminal DQ via the output buffer 32 and the output transistor 33. The output clock generator 31 generates the output timing clocks oclk0 and oclk1 from an output enable signal OE and a clock signal, which signals are supplied from the outside of the semiconductor device.

However, the above-mentioned conventional data output circuit has a large time delay due to an arrangement in which the FIFO memory 10 and the PS converter circuit 20 are separately configured and provided, and does not operate at a high speed.

SUMMARY OF THE INVENTION

It is a general object of the present invention to eliminate the above disadvantage.

A more specific object of the present invention is to provide a latch circuit, a data output circuit and a semiconductor device having these circuits, in which there is a reduced time delay and high-speed operation is enabled.

The above objects of the present invention are achieved by a latch circuit comprising: a plurality of data latch circuits to which N-bit parallel data are respectively applied where N is an integer; a data input control circuit setting the data latch circuits to a data input state in order; and a data output control circuit which controls the data latch circuits to output, at different timings, latched data to M output terminals in the order of latch in the data latch circuits where $N \div M \geq 1$.

The above latch circuit may be configured so that: the data output control circuit supplies data output timing signals which have mutually different phases to the corresponding data latch circuits; and the data latch circuits output the latched data in the corresponding data output timing signals.

The above objects of the present invention are also achieved by a data output circuit comprising: a latch circuit; and an output part, wherein the above latch circuit is configured as described above.

The above data output circuit may be configured so that the output part selects the M-bit data in parallel at the M output terminals into the serial data by two clock signals which have a frequency higher than a transfer clock signal by which the N-bit parallel data are transferred to the data latch circuit and which have a complementary relation.

The data output circuit may be configured so that the output part selects the M-bit data in parallel at the M output terminals into the serial data by a plurality of clock signals which have a frequency higher than a transfer clock signal by which the N-bit parallel data are transferred to the data latch circuit and which have mutually different phases.

The data output circuit may be configured so that the clock signals have a bit rate equal to twice that of the transfer clock signal.

The above objects of the present invention are also achieved by a semiconductor device comprising: a memory core part; input terminals to which N-bit parallel data read from the memory core part are applied; and a data output circuit which converts the N-bit parallel data into serial data. The data output circuit comprises a latch circuit and an output part. The latch circuit is configured as described.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3B:
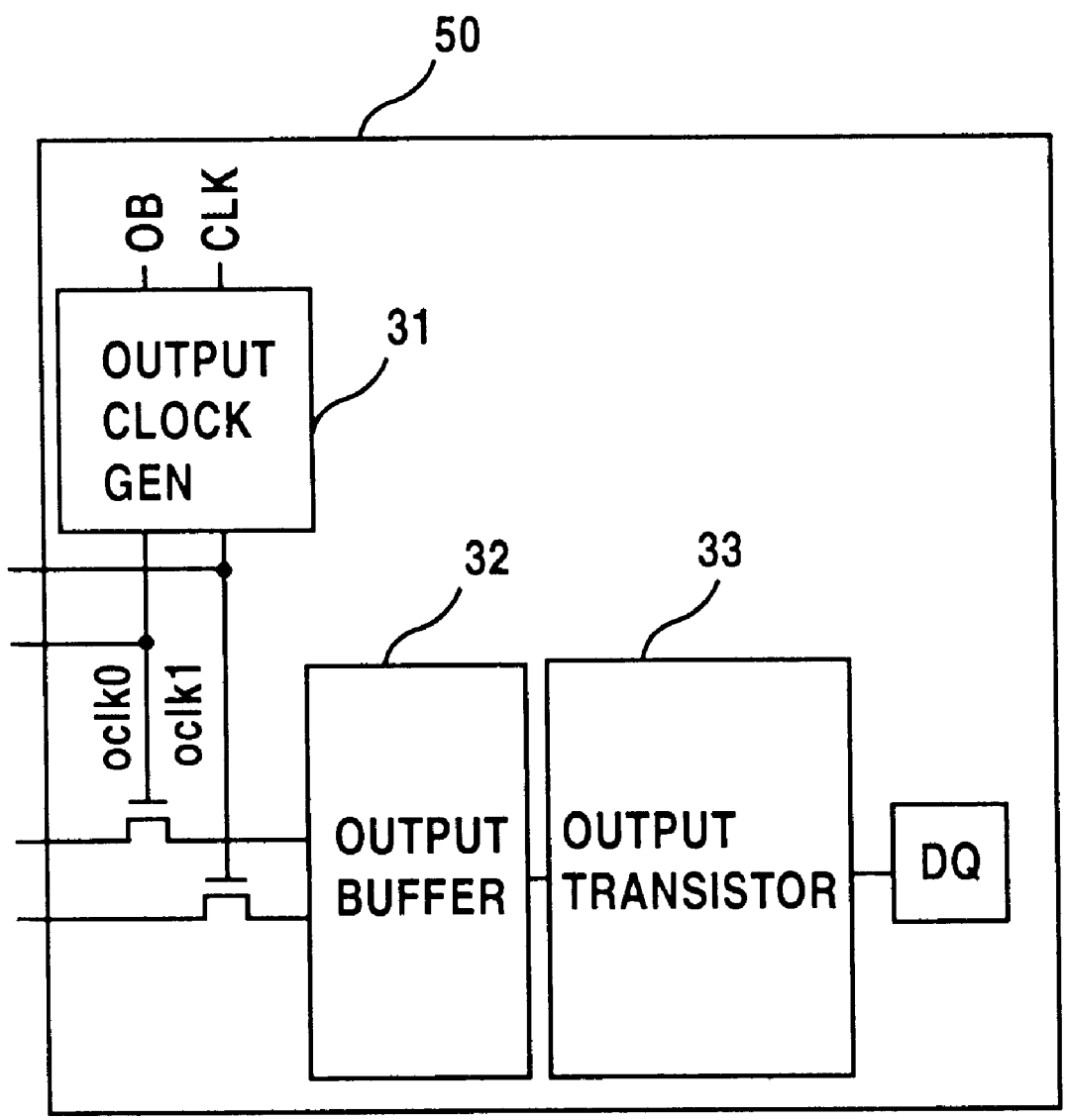
FIG. 3 is a circuit diagram of a data output circuit according to a first embodiment of the present invention.

FIG. 3 is a circuit diagram of a data output circuit having a latch circuit according to a first embodiment of the present invention. In FIG. 3, parts that are the same as those shown in the previously described figures are given the same reference numbers.

The data output circuit shown in FIG. 3 includes an FIFO memory 40 and an output part 50. The FIFO memory 40 is a latch circuit having a parallel-to-serial conversion function, more particularly, a 4:1 parallel-to-serial conversion function. In order to implement the 4:1 PS conversion function, the FIFO memory 40 includes two output pointers 13 and 14 in addition to the aforementioned input pointer 11 and the data latch circuits DLAT0–DLAT3. The two output pointers 13 and 14 generate control signals so that the data latched in the data latch circuits DLAT0–DLAT3 are output, in the order of latch, to two output terminals qmpx0 and qmpx1 at different timings.

The input pointer 11 forms a data input control circuit, and the output pointers 13 and 14 form a data output control circuit.

More particularly, the output pointer 13 generates control signals po00, po02, po10, po12, po20, po22, po30 and po32 from the output timing clock oclk0. The output pointer 14 generates control signals po01, po03, po11, po13, po21, po23, po31 and po33 from the output timing clock oclk1. The control signals po00 and po02 control the transfer gates provided at the output sides of the latch elements Latch0 and Latch2 of the data latch circuit DLAT0, and the output signals pool and po03 control the transfer gates provided at the output sides of the latch elements Latch1 and Latch3 of the data latch circuit DLAT0. Similarly, the remaining control signals control the output-side transfer gates.

The output terminals of the latch elements Latch0 and Latch2 of each of the data latch circuits DLAT0–DLAT3 are coupled together via the respective output-side transfer gates, so that the output qmix0 is formed. Similarly, the output terminals of the latch elements Latch1 and Latch3 are coupled together via the respective output-side transfer gates, so that the output qmix1 is formed.

The output part 50 includes two transfer gates, the output clock generator 31, the output buffer 32, the output transistor 33 and the data output terminal DQ. The output part 50 does not have the two latch elements Latch0 and Latch1 provided in the conventional output part 30. The output part performs the 2:1 parallel-to-serial converting operation.

Figure 4:
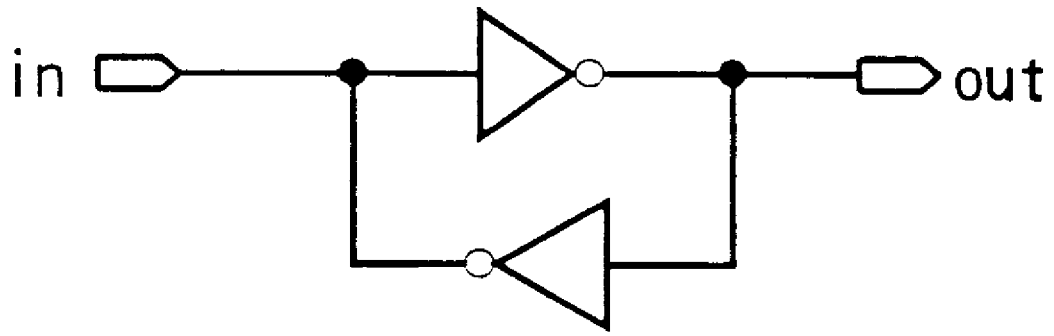
FIG. 4 is a circuit diagram of a latch element used in the data output circuits.

FIG. 4 is a circuit diagram of an example of each of the latch elements Latch0–Latch3 shown in FIG. 3. Each of the latch elements Latch0–Latch 3 is formed of two inverters.

A description will now be given, with reference to FIG. 5, of an operation of the data output circuit shown in FIG. 3.

A read command is received by a semiconductor device having the output circuit shown in FIG. 3, and data "0"–"19" read from a memory core part of the device (omitted for the sake of simplicity) are transferred over a data bus in synchronism with the data pulse (D-pulse) signal, and are applied to the FIFO memory 40 via the data input terminals MDB0–MDB3. The input data are latched inn the latch elements Latch0–Latch3 of the data latch circuits DLAT0–DLAT3 in response to the control signals pi0–pi3 from the input pointer 11. In FIG. 5, the latch element Latch0 of the data latch circuit DLAT0 is indicated as DLAT0_L0, as in the case of FIG. 2. For example, in response to the control signal pi0, the latch elements DLAT0_L0 (Latch0) –DLAT3_L3 (Latch3) of the data latch circuit DLAT0 latch input data "0"–"3", respectively. The above operation is the same as the previously described operation of the conventional circuit.

Figure 5:
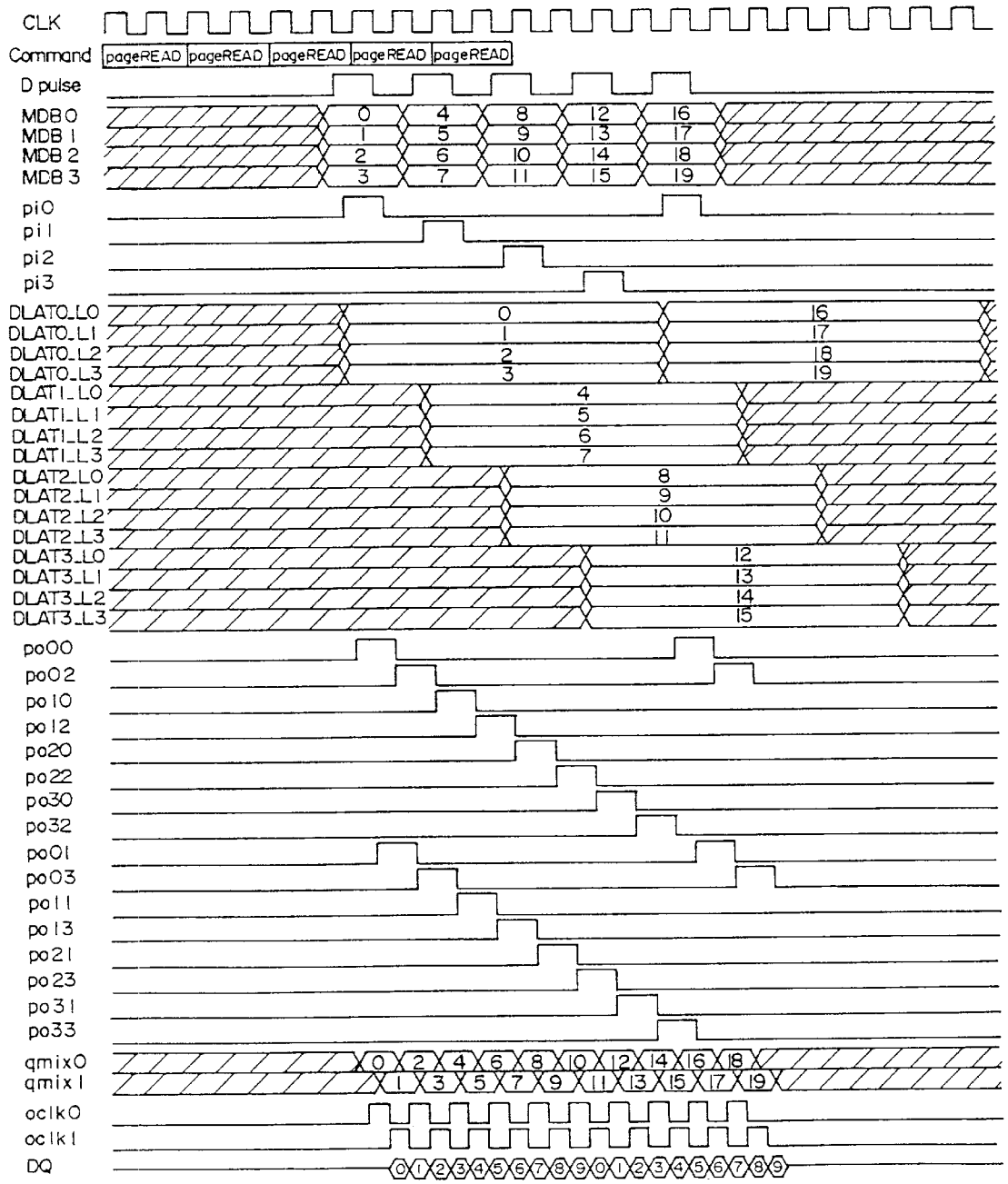
FIG. 5 is a timing chart of an operation of the data output circuit shown in FIG. 3.

As shown in FIG. 5, the output pointer 13 outputs the control signals po00, po02, po10, po12, po20, po22, po30 and po32 at different timings in order. Hence, a data train "0", "2", "4", . . . is available at the output qmix0. As shown in FIG. 5, the output pointer 14 outputs control signals po01, po03, po11, po13, po21, po23, po31 and po33 at different timings in order. Hence, a data train "1", "3", "5", . . . is available at the output qmix1. When the number of items of parallel input data is denoted as N, N=4 in the configuration shown in FIG. 3. Since the number M of the output signals (terminals) of the FIFO memory 40 is equal to 2, N is greater than M (N>M). Generally, the parameters M and N are required to satisfy a condition such that $N \geq M \geq 1$.

The data strain qmix0 is applied to the output buffer 32 in response to the output timing clock oclk0 output by the output clock generator 31, and the data train qmix1 is applied to the output buffer 32 in response to the output timing clock oclk1. The output timing clocks oclk0 and oclk1 have the complementary relationship and a cycle equal to half the period of the data pulse (D-pulse) signal. The serial data "0", "1", "2", . . . is output to the data output terminal DQ via the output transistor 32.

Figure 1:
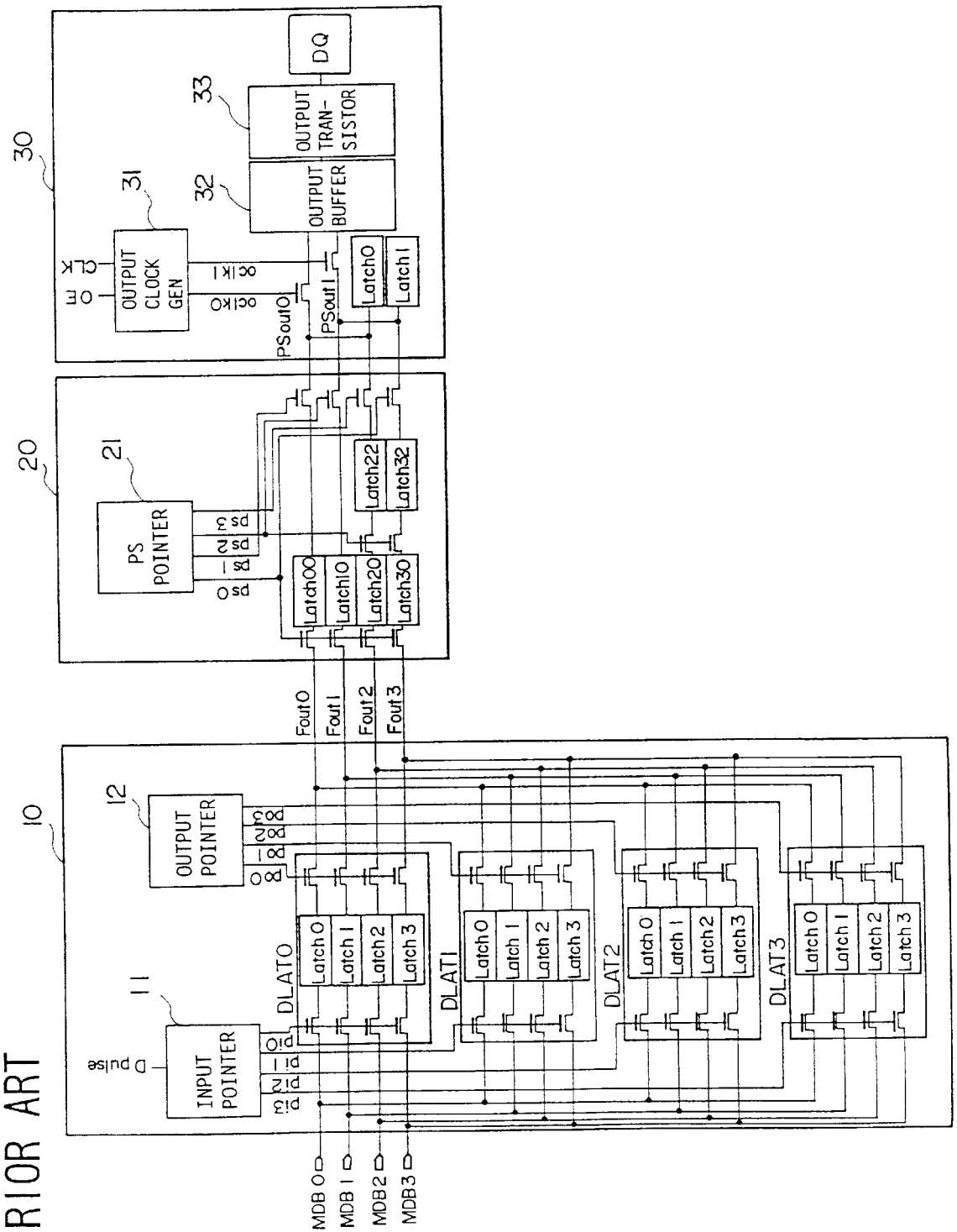
FIG. 1 is a circuit diagram of a conventional data output circuit.
Figure 2:
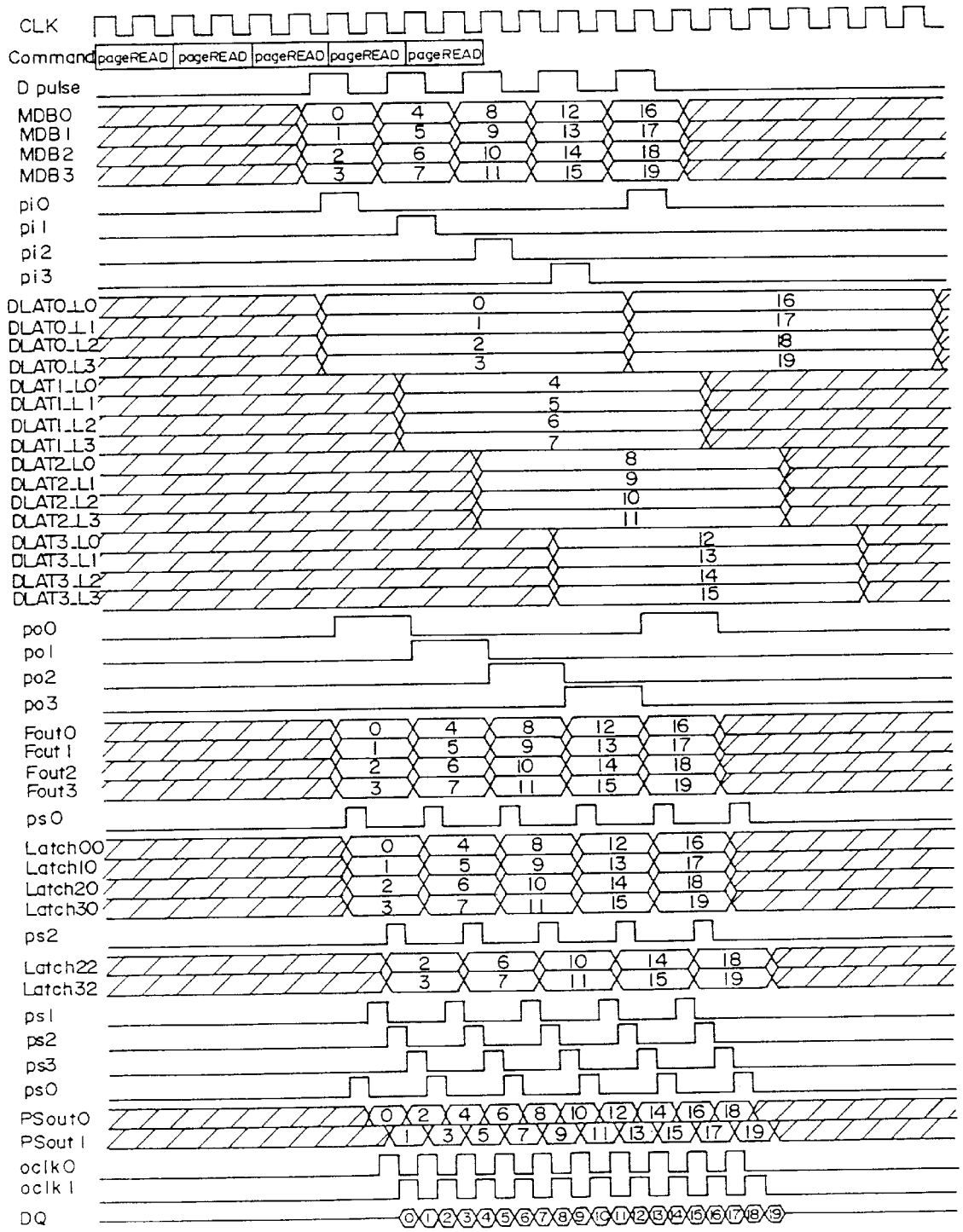
FIG. 2 is a timing chart of an operation of the data output circuit shown in FIG. 1.

It can be seen from the comparison between FIGS. 2 and 5 that data "0" shown in FIG. 5 appears in the data output terminal DQ ahead of data "2" shown in FIG. 2. In other words, the timing at which data "0" is available at the data output terminal DQ shown in FIG. 5 leads to the timing at which data "0" is available at the data output terminal DQ shown in FIG. 2. The above effect of the data output circuit shown in FIG. 3 results from the particular arrangement in which the FIFO memory 40 has the parallel-to-serial conversion function implemented by controlling the output timing of the FIFO memory 40 of the latch circuit and thus the conventional PS converter circuit 20 is omitted. It should be noted that the number of elements through which data are transferred from the data input terminals MDB0–MDB3 to the data output terminal DQ in the configuration shown in FIG. 3 is smaller than that in the configuration shown in FIG. 1.

Figure 6:
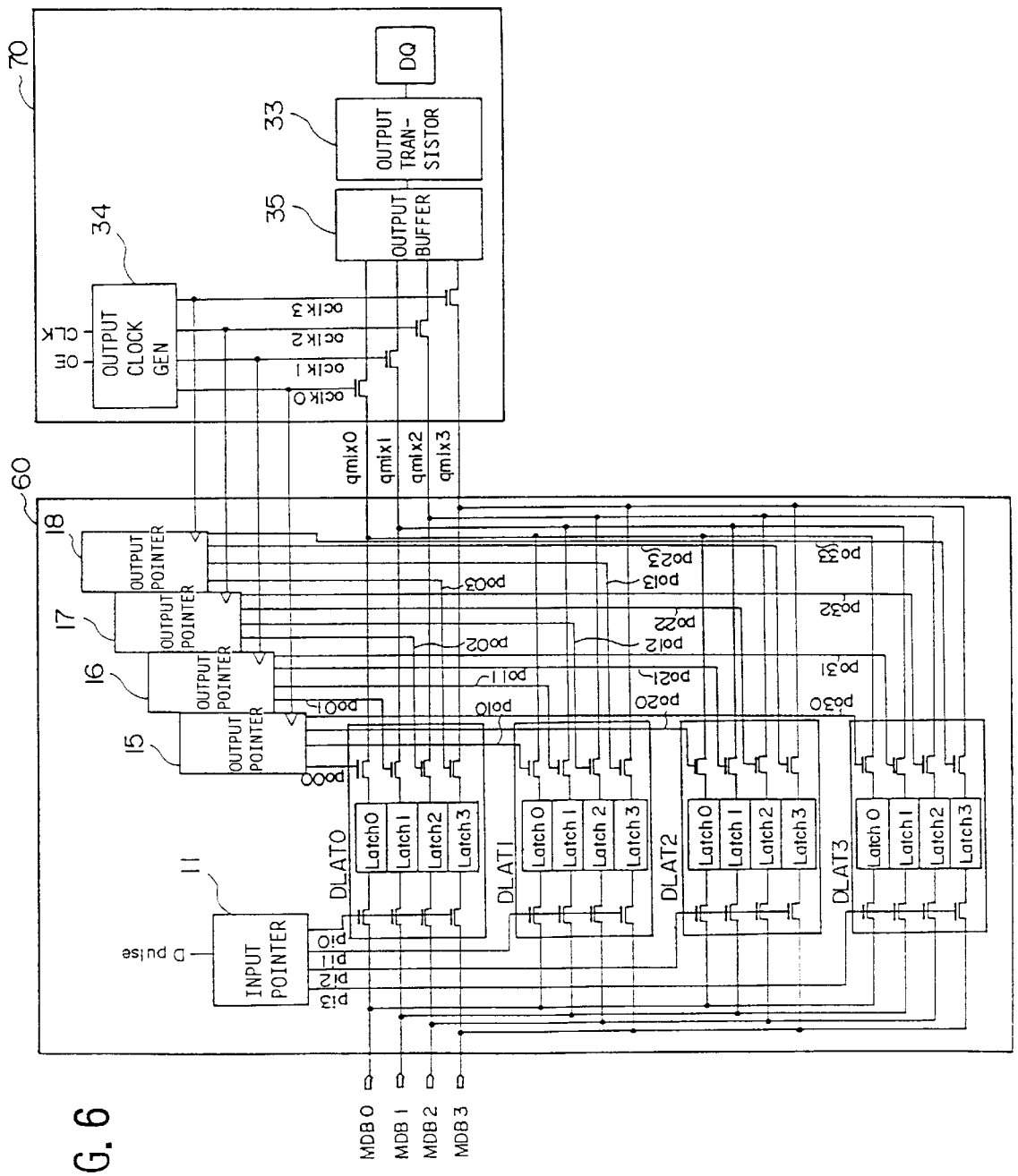
FIG. 6 is a circuit diagram of a data output circuit according to a second embodiment of the present invention.

FIG. 6 is a circuit diagram of a data output circuit according to a second embodiment of the present invention. In FIG. 6, parts that are the same as those shown in the previously described figures are given the same reference numbers. The data output circuit shown in FIG. 6 includes an FIFO memory part 60 and an output part 70. This configuration is characterized in that the output part 70 performs a 4:1 parallel-to-serial conversion. Hence, the FIFO memory part 60 does not perform the 4:2 parallel-to-serial conversion as in the case of the first embodiment of the present invention. However, the FIFO memory part 60 determines the output timings at which the latched data are output so that the output part 70 can perform the 4:1 parallel-to-serial conversion. The output timings are defined by four output pointers 15, 16, 17 and 18 of the FIFO memory part 60 shown in FIG. 6. Four outputs qmix0, qmix1, qmix2 and qmix3 of the FIFO memory 60 are output to the output part 70.

The four transfer gates of the output part 70, which are controlled by output timing clocks oclk0, oclk1, oclk2 and oclk3 output by the output clock generator 34, receive the outputs qmix0, qmix1, qmix2 and qmix3 from the FIFO memory 60. Hence, the 4:1 parallel-to-serial conversion can be implemented. The serial data passing through the transfer gates is output to the data output terminal DQ via the output buffer 35 and the output transistor 33.

Figure 7:
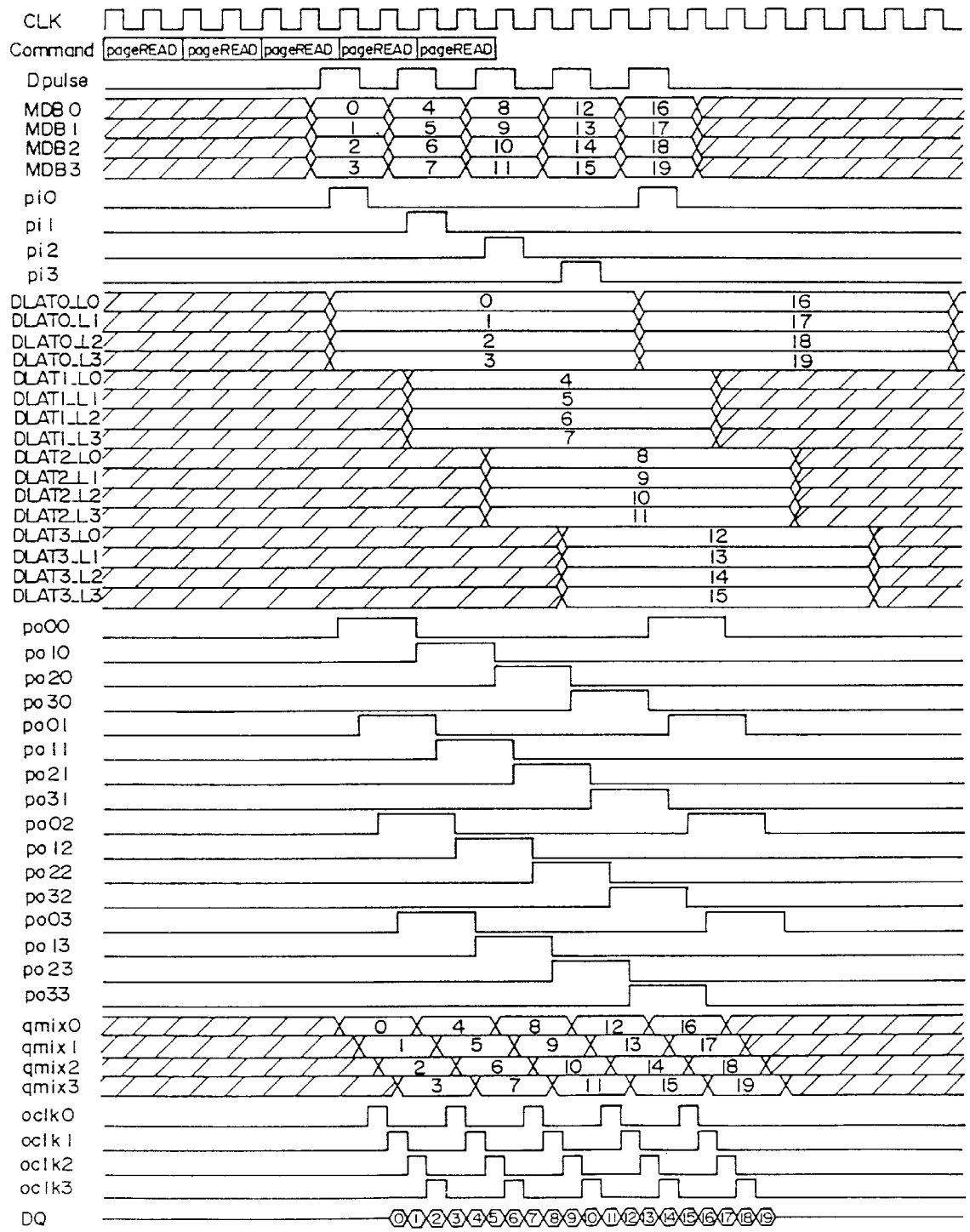
FIG. 7 is a timing chart of an operation of the data output circuit shown in FIG. 6.

The data output circuit shown in FIG. 6 operates as shown in FIG. 7. The operation executed until input data are latched in the data latch circuit DLAT0–DLAT3 is the same as that of the first embodiment of the present invention.

As shown in FIG. 7, the output pointer 15 generates the control signals po00, po10, po20 and po30. For example, the rising edge of the control signal po10 coincides with the falling edge of the control signal po00. Similarly, the pointer 16 generates the output signals po01, po11, po21 and po31. The rising edge of the control signal po02 slightly lags behind the rising edge of the control signal pool (strictly speaking, the above delay is equal to half the cycle of the clock CLK). Similarly, the output pointer 18 generates the control signals po03, po13, po23 and po33. The rising edge of the control signal po03 slightly lags behind the rising edge of the control signal po02. When the number of items of the parallel input data is denoted as N, N is equal to 4 in the configuration shown in FIG. 3 and is equal to M which indicates the number of outputs of the FIFO memory 40. Generally, $N \geq M \geq 1$.

The control signals po00, po01, po02 and po03 control the transfer gates provided at the output side of the data latch circuit DLAT0. The control signals po10, po11, po12 and po13 control the transfer gates provided at the output side of the data latch circuit DLAT1. The control signals po20, po21, po22 and po23 control the transfer gates provided at the output side of the data latch circuit DLAT2. The control signals po30, po31, po32 and po33 control the transfer gates provided at the output side of the data latch circuit DLAT3. Hence, the four outputs qmix0–qmix3 of the FIFO memory part 60 are data trains as shown in FIG. 7.

The output clock generator 34 generates output timing clocks oclk0–oclk3 shown in FIG. 7 from the output enable signal OE and the clock signal CLK, these signals being supplied from the outside of the semiconductor device. The falling edge of the clock oclk3 coincides with the rising edge of the clock oclk0. By using the output timing clocks oclk0–oclk3, the output signals qmix0–qmix3 are converted, through the output buffer 35 and the output transistor 33, into serial data, which is available at the data output terminal DQ, as shown in FIG. 7.

It can be seen from the comparison between FIGS. 2 and 7 that data "0" appears at the data output terminal DQ in the configuration shown in FIG. 7 ahead of data "0" in the configuration shown in FIG. 2. The above effect of the data output circuit shown in FIG. 7 results from the particular arrangement in which the FIFO memory 60 has the output timings controlled and has the parallel-to-serial conversion function so that the conventional PS converter circuit 20 is omitted. It should be noted that the number of elements through which data are transferred from the data input terminals MDB0–MDB3 to the data output terminal DQ in the configuration shown in FIG. 6 is smaller than that in the configuration shown in FIG. 1.

A description will now be given of an SDRAM device equipped with the data output circuit of the present invention.

Figure 8:
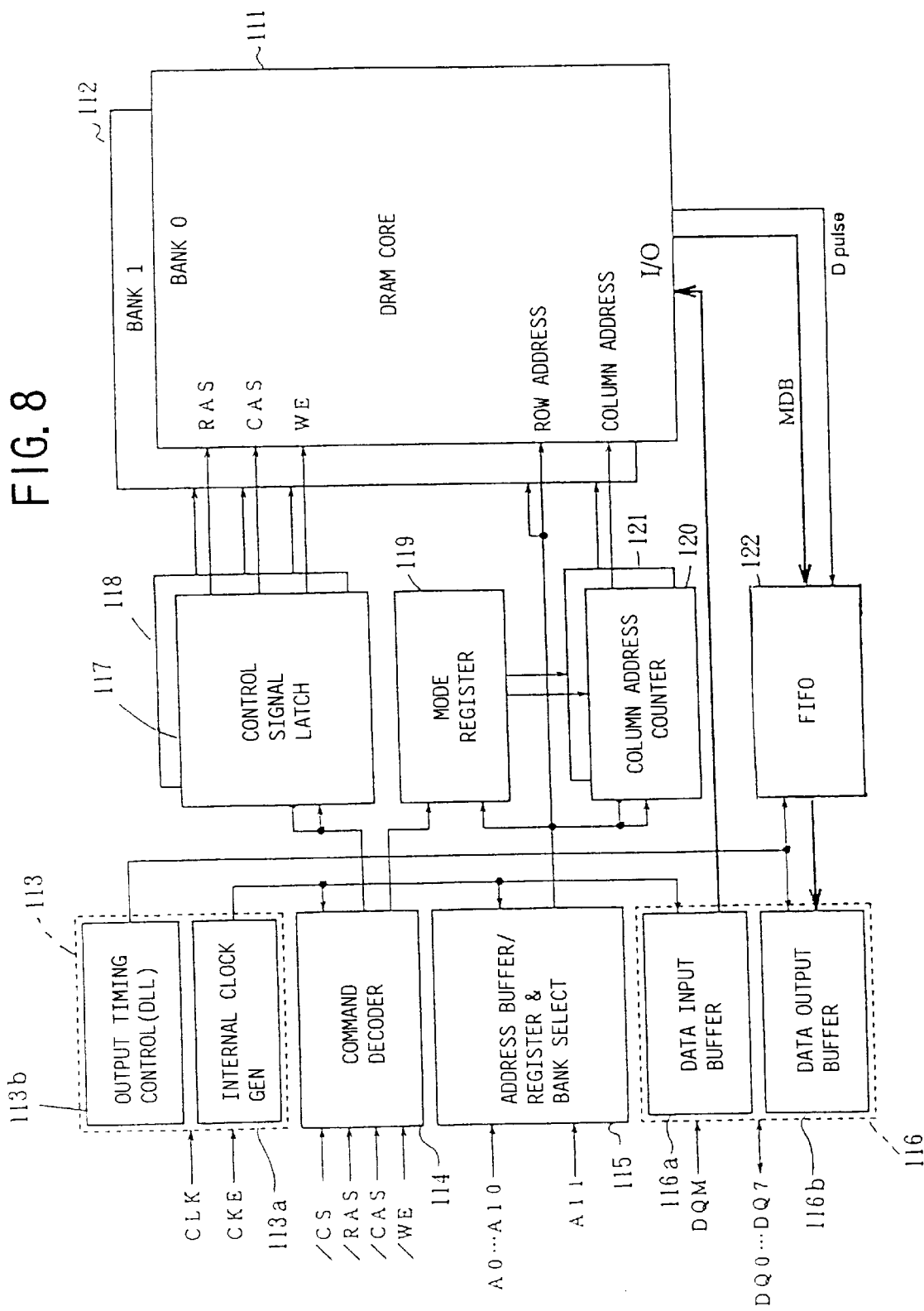
FIG. 8 is a block diagram of a semiconductor memory device equipped with the data output circuit according to the present invention.

FIG. 8 is a block diagram of an overall structure of the above SDRAM device. The SDRAM device has a plurality of banks 111 (BANK-0) and 112 (BANK-1). Although only two banks are illustrated in the configuration shown in FIG. 8, more than two banks (for example, four banks) are provided in practice.

Each of the banks 111 and 112 includes a respective DRAM core. The SDRAM device includes a clock buffer 113, a command decoder 114, an address buffer/register and bank selector 115, an input/output data buffer 116, control signal latch circuits 117 and 118, a mode register 119, column address counters 120 and 121, and an FIFO memory 112. The input/output data buffer 116 includes a data input buffer 116a and a data output buffer 116b.

The clock buffer 113 includes an internal clock generating circuit 113a and an output timing control circuit 113b, and externally receives the clock signal CLK and a clock enable signal CKE. This clock enable signal CKE indicates whether the clock signal CLK should be taken in the DRAM device. The internal clock generating circuit 113a generates internal clock signals necessary for the internal operations, and outputs the internal clock signals to the blocks 114, 115 and the data input buffer 116a. The output timing control circuit 113b outputs a clock signal to the data output buffer 116b in order to enable data to be output in synchronism with the clock signal CLK externally supplied. The clock signal CLK received by the output clock generators 31 and 34 shown in FIGS. 3 and 6 is the clock signal generated by the output timing control circuit 113b. The output timing clock control signal 113b can be configured by a DLL (Delay Locked Loop) circuit.

The command decoder 114 decodes a chip select signal /CS ("/" denotes an active-low signal), a row address strobe signal /RAS, a column address strobe signal /CAS, and a write enable signal /WE, and generate control signals corresponding to commands defined by the above signals. The control signals are applied to the control signal latch circuits 117 and 118 and the mode register 119.

The address buffer/decoder and bank selector 115 temporarily store address signals A0–A11 and then decodes these signals. The decoded signals are output to the mode register 119, the banks 111 and 112 and the column address counters 120 and 121. The address signal A11 is used for bank selection.

The input/output data buffer 116 controls inputting and outputting of data. Input data DQM externally supplied is supplied to the DRAM cores 111 and 112 via the data input buffer 116a. The data output buffer 116b corresponds to the output parts 50 and 70 shown in FIGS. 3 and 6. An FIFO memory 122 corresponds to the FIFO memories 40 and 60 shown in FIGS. 3 and 6.

The mode register 119 is supplied with given decoded commands and the given address signals, and resets a predetermined operation mode such as a burst mode. In the burst mode, a predetermined number of data bits are stored and written into the selected memory cells. In order to realize the burst mode, the mode register 119 controls the count operation of the column address counters 120 and 121. The column address counters 120 and 121 count the decoded address signal, and thus generates column addresses. When the burst mode is specified by the mode register 119, the column address counters 120 and 121 change the count operations so that the column addresses are output intermittently.

The DRAM cores 111 and 112 have memory cell arrays, row address decoders, column address decodes and sense amplifiers.

Figure 9:
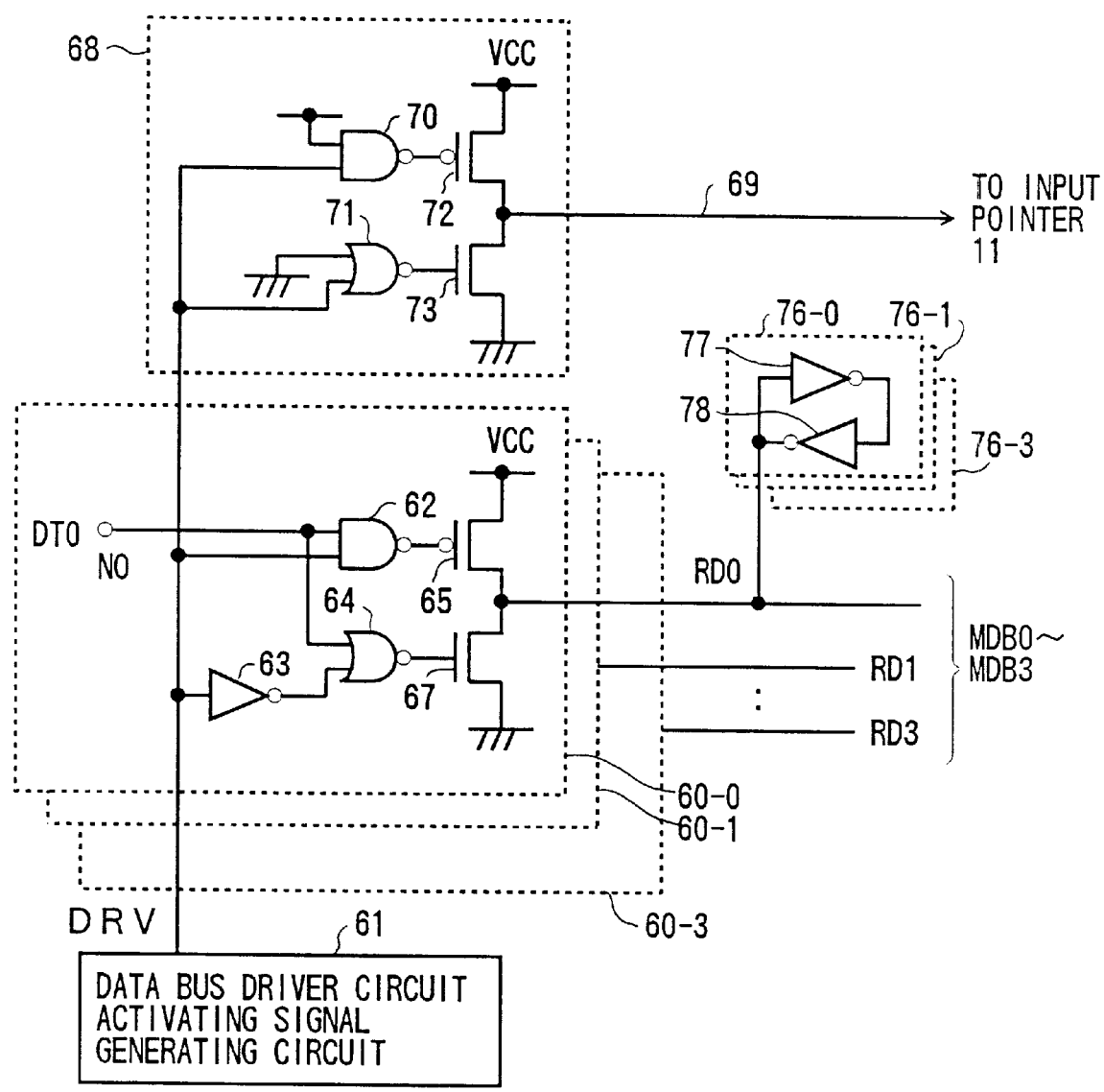
FIG. 9 is a circuit diagram of circuit parts related to a data output route provided in a DRAM core part.

FIG. 9 is a circuit diagram of circuit parts of the DRAM cores 111 and 112 related to the data output circuits shown in FIGS. 2 and 6. Data bus driver circuits 60-0, 60-1, ..., 60-3 are provided for the respective bits of four bits of read data DT0, DT1, ..., DT3. Symbols RD0, RD1, ..., RD3 indicate data bus lines respectively driven by the data bus driver circuits 60-1 through 60-3. Read data RD0–RD3 output from the memory core part are transferred to the data input terminals MDB0–MDB3 via the data bus lines RD0–RD3, respectively.

A data bus driver circuit activating signal generating circuit 61 activates and disactivates the data bus driver circuits 60-0–60-3 in response to a data bus driver circuit activating signal DRV. The data bus driver circuits 60-0–60-3 have an identical circuit configuration. A node N0 of the data bus driver circuit 60-0 is supplied with data DT0 output from the memory core part.

The data bus driver circuit 60-0 is made up of a NAND gate 62-, an inverter 63, a NOR gate 64, a pMOS transistor 65 and an nMOS transistor 67. The source of the pMOS transistor 65 is connected to a power supply voltage VCC, and the source of the nMOS transistor 67 is grounded. When the activating signal DRV is at a low level, the NAND gate 62 outputs a high-level signal, and the pMOS transistor 65 is OFF. Further, the NOR gate 64 outputs a low-level signal, and the nMOS transistor 67 is OFF. Hence, the output terminal of the data bus driver circuit 60-0 is in a high-impedance state. When the activating signal is at a high level, the NAND gate 62 functions as an inverter with respect to read data DT0. Further, the output of the inverter 63 is at the low level. Hence, the NOR gate 64 functions as an inverter with respect to read data DT0.

When the read data DT0 is at the high level, the output signal of the NAND gate 62 is at the low level, and the pMOS transistor 65 is ON. Further, the output signal of the NOR gate 64 is at the low level, and the nMOS transistor 67 is OFF. Hence, the data bus RD0 is set to the high level. When the read data DT0 is at the low level, the output signal of the NAND gate 62 is at the high level, and the pMOS transistor 65 is OFF. Further, the output signal of the NOR gate 64 is at the high level, and the nMOS transistor 67 is ON. Hence, the data bus RD0 is set to the low level.

A data bus state transition monitor signal generating circuit 68 receives the activating signal DRV, and thus generates a data bus state transition monitor signal, which indicates the timing at which a state transition occurs in the data bus lines RD0, RD1, ..., RD3. The above monitor signal corresponds to the data pulse (D-pulse) signal. The D-pulse signal is transferred over a signal line 69, and is output to the input pointer 11. The circuit 68 is made up of a NAND gate 70, a NOR gate 71, a pMOS transistor 72, and an nMOS transistor 73. When the activating signal DRV is at the low level, the output signal of the NAND gate 70 is low, and the pMOS transistor 72 is OFF. Further, the output signal of the NOR gate 71 is high, and the nMOS transistor 73 is ON. Hence, the D-pulse signal is at the low level. When the activating signal DRV is at the high level, the output signal of the NAND gate 70 is low, and the pMOS transistor 72 is ON. Further, the output signal of the NOR gate 71 is low, and the nMOS transistor 73 is OFF. Hence, the D-pulse signal is at the high level.

The present invention is not limited to the specifically disclosed embodiments, and variations and modifications may be made without departing from the scope of the present invention.

What is claimed is:

1. A latch circuit comprising:
    a plurality of data latch circuits to which N-bit parallel data are respectively applied where N is an integer;

a data input control circuit setting the data latch circuits to a data input state in order; and a data output control circuit which controls the data latch circuits to output, at different timings, latched data to M output terminals in the order of latch in the data latch circuits where $N \geq M \geq 1$.

2. The latch circuit as claimed in claim 1, wherein:

the data output control circuit supplies data output timing signals which have mutually different phases to the corresponding data latch circuits; and the data latch circuits output the latched data in the corresponding data output timing signals.

3. A data output circuit comprising:

a latch circuit; and an output part, said latch circuit comprising:

N data latch circuits to which N-bit parallel data are respectively applied where N is an integer;

a data input control circuit setting the data latch circuits to a data input state in order; and a data output control circuit which controls the N data latch circuits to output, at different timings, latched data to M output terminals in the order of latch in the N data latch circuits where $N \geq M \geq 1$, the output part converting M-bit data in parallel available at the M output terminals into serial data.

4. The data output circuit as claimed in claim 3, wherein the output part selects the M-bit data in parallel at the M output terminals into the serial data by two clock signals which have a frequency higher than a transfer clock signal by which the N-bit parallel data are transferred to the data latch circuit and which have a complementary relation.

5. The data output circuit as claimed in claim 3, wherein the output part selects the M-bit data in parallel at the M output terminals into the serial data by a plurality of clock signals which have a frequency higher than a transfer clock signal by which the N-bit parallel data are transferred to the data latch circuit and which have mutually different phases.

6. The data output circuit as claimed in claim 4, wherein the two clock signals have a bit rate equal to twice that of the transfer clock signal.

7. The data output circuit as claimed in claim 5, wherein the plurality of clock signals have a bit rate equal to twice that of the transfer clock signal.

8. A semiconductor device comprising:

a memory core part;

input terminals to which N-bit parallel data read from the memory core part are applied; and a data output circuit which converts the N-bit parallel data into serial data, wherein said data output circuit comprises a latch circuit and an output part, and wherein said latch circuit comprises:

N data latch circuits to which N-bit parallel data are respectively applied where N is an integer;

a data input control circuit setting the data latch circuits to a data input state in order; and a data output control circuit which controls the N data latch circuits to output, at different timings, latched data to M output terminals in the order of latch in the N data latch circuits where $N \geq M \geq 1$, the output part converting M-bit data in parallel available at the M output terminals into serial data.

9. The semiconductor device as claimed in claim 8, wherein the output part selects the M-bit data in parallel at the M output terminals into the serial data by a plurality of clock signals which have a frequency higher than a transfer clock signal by which the N-bit parallel data are transferred to the data latch circuit and which have mutually different phases.

10. The semiconductor device as claimed in claim 9, wherein said transfer clock is generated within the semiconductor device.

11. The semiconductor device as claimed in claim 8, wherein the semiconductor device is a synchronous dynamic random access memory device.

12. The latch circuit as claimed in claim 1, wherein said data input control circuit outputs data input timing signals at different timings respectively to said plurality of data latch circuits in response to a transfer clock signal by which the N-bit parallel data are transferred to the data latch circuit.

13. The latch circuit as claimed in claim 12, wherein said transfer clock signal is generated within a semiconductor device.

14. The latch circuit as claimed in claim 13, wherein the semiconductor device is a synchronous dynamic random access memory.

15. The latch circuit as claimed in claim 1, wherein each of said data latch circuits has N input terminals for receiving the N-bit parallel data and N latch output terminals for outputting N-bit latched data.

16. The latch circuit as claimed in claim 15, further comprising:

N output gates each coupled between corresponding latch output terminal of said N latch output terminals and corresponding output terminal of said M output terminals, wherein said N-bit latched data are output at different timings from said N output gates.

17. The latch circuit as claimed in claim 16, wherein said data output control circuit outputs data output timing signals to said N output gates at different timings.

18. The latch circuit as claimed in claim 17, wherein said data output timing signals have mutually different phases.

19. The latch circuit as claimed in claim 17, wherein said data output timing signals applied to said output gates which are coupled to different output terminals, have mutually different phases, and active periods of said data output timing signals are overlapped.

20. The latch circuit as claimed in claim 17, wherein said data input control circuit outputs data input timing signals are different timings respectively to said plurality of data latch circuits, and wherein an output interval of said data input timing signals is longer than that of said data output timing signals which are supplied to adjacent two output gates.

* * * * *